US006214408B1

(12) United States Patent
Bähr et al.

(10) Patent No.: US 6,214,408 B1
(45) Date of Patent: Apr. 10, 2001

(54) METHOD FOR THE OPERATION OF AN ELECTRON BEAM

(75) Inventors: Martin Bähr, Haundorf-Gräfensteinberg; Erik Laux, Erlensee, both of (DE)

(73) Assignee: Balzers und Leybold Deutschland Holding AG, Hanau (DE)

( * ) Notice: Subject to any disclaimer, the term of this patent is extended or adjusted under 35 U.S.C. 154(b) by 0 days.

(21) Appl. No.: 09/173,743

(22) Filed: Oct. 16, 1998

(30) Foreign Application Priority Data

Oct. 16, 1997 (DE) .............................. 197 45 771

(51) Int. Cl.[7] .............. B05D 3/06; C23C 14/30
(52) U.S. Cl. .......... 427/8; 427/566; 219/121.17; 219/121.28; 219/121.29; 219/121.3
(58) Field of Search ..................... 427/566, 567, 427/596, 597, 8; 118/723 EB, 723 ER, 723 MR, 729; 219/121.16, 121.17, 121.25, 121.26, 121.27, 121.28, 121.29, 121.3

(56) References Cited

U.S. PATENT DOCUMENTS

| 3,046,936 | * | 7/1962 | Simons, Jr. | 118/723 EB |
| 3,949,187 | * | 4/1976 | Wulff | 118/723 EB |
| 4,042,801 | * | 8/1977 | Gay et al. | 219/121.13 |

(List continued on next page.)

FOREIGN PATENT DOCUMENTS

| 1521584 | * | 10/1969 | (DE) | 427/566 |
| 3532888 | | 4/1987 | (DE) . | |
| 35 38 857 A1 | | 7/1987 | (DE) . | |

(List continued on next page.)

OTHER PUBLICATIONS

Application of a New Fast EB–Gun Control System for Complex Melting Processes, Blum et al. Oct. 11–13, 1995, or Source.

New Scan and Control System (Escosys) for High Power Electron Beam Techniques, Bähr et al., pp. 1–20, Sep. 1996. or source.

What Is the Fast Fourier Transform?, Proceedings of the Ieee, vol. 55, No. 10, Oct. 1967, Cochran et al.

Primary Examiner—Marianne Padgett
(74) Attorney, Agent, or Firm—Smith, Gambrell & Russell, LLP

(57) ABSTRACT

A method is disclosed for the operation of a high-power electron beam for the vaporization of materials in a target. With this method, static and dynamic deflection errors are corrected. First, the static and dynamic deflection errors are ascertained by means of a teach-in process for concrete spatial coordinates and concrete frequencies of the deflection currents and stored in a memory. For the later operation, this stored data is used in such a way that input geometric data for the incidence points of the electron beam is automatically recalculated into corrected current values which bring about the exact incidence onto the input points. A corresponding procedure takes place with the input of frequencies for the deflection current. The input frequencies are automatically corrected in terms of frequency and amplitude in order to eliminate the frequency-dependent attenuation effects. Both in the correction of the static and in the correction of the dynamic deflection errors it is guaranteed by suitable interpolation methods that even the spatial coordinates and frequencies not considered in the teach-in process are taken into account. Finally, a method is specified with which it is possible by mere specification of a power distribution on a crucible surface to control the electron beam such that the specified data is satisfied.

7 Claims, 13 Drawing Sheets

U.S. PATENT DOCUMENTS

| | | | |
|---|---|---|---|
| 4,230,739 | * 10/1980 | Aichert et al. | 427/597 |
| 4,237,148 | * 12/1980 | Aichert et al. | 427/597 |
| 4,238,525 | * 12/1980 | Aichert et al. | 427/597 |
| 4,604,293 | * 8/1986 | Shirahata et al. | 427/566 |
| 4,611,330 | * 9/1986 | Bauer et al. | 219/121 |
| 4,627,989 | * 12/1986 | Feuerstein et al. | 427/10 |
| 4,721,842 | * 1/1988 | Farrell | 219/121.28 |
| 4,791,301 | 12/1988 | Bauer et al. | 250/397 |
| 4,843,246 | 6/1989 | Benes et al. | 250/491.1 |
| 4,973,818 | * 11/1990 | Bittenbrünn et al. | 219/121.28 |
| 4,988,844 | 1/1991 | Dietrich et al. | 219/121.17 |
| 5,051,599 | 9/1991 | Benes | 250/491.1 |
| 5,229,570 | * 7/1993 | Kaufmann et al. | 219/121.28 |
| 5,302,208 | 4/1994 | Grimm et al. | 118/718 |
| 5,432,314 | * 7/1995 | Yamazaki et al. | 219/121.25 |
| 5,532,446 | 7/1996 | Blum et al. | 219/121.25 |

FOREIGN PATENT DOCUMENTS

| | | |
|---|---|---|
| 39 02 274 C2 | 8/1990 | (DE) . |
| 42 03 632 A1 | 8/1993 | (DE) . |
| 42 08 484 A1 | 9/1993 | (DE) . |
| 0 184 680 | 6/1986 | (EP) . |
| 0368037 | 5/1990 | (EP) . |
| 404109429 * | 4/1992 | (JP) ..................... 427/567 |
| 406192823 * | 7/1994 | (JP) ............... 118/723 EB |

* cited by examiner

METHOD FOR THE OPERATION OF AN ELECTRON BEAM

INTRODUCTION AND BACKGROUND

The present invention pertains to a method for the operation of a high-power electron beam employed for the vaporization of materials.

Metals and metal alloys of high quality can be produced by means of an electron beam melting process. The use of an electron beam as a heat source for melting metals and alloys has the advantage that very complex melting processes can be implemented, because the electron beam is deflectable and thus can reach different places on the surface of a metal block or a metal melt.

Nearly any material can be effectively vaporized with the aid of electron beam technology. The vaporization rate is roughly 100 times greater than that of the sputtering process. Apart from the standard processes with aluminum, materials with a high melting point and high vaporization temperature are of particular interest for the electron beam vaporization technique. Among these materials are, for instance, Cr, Co, Ni, Ta, W, alloys thereof or oxides like $SiO_2$, $Al_2O_3$, $ZrO_2$, MgO. Electron beam technology also provides the required stable and uniform vaporization rates for reactive vaporization, such as $Al+O_2 \rightarrow Al_2O_3$.

A particularly important field of application of electron beam vaporization is represented by the coating of large surfaces with various materials, for instance the coating of magnetic tapes with CoNi alloys or the coating of films for the packaging of foodstuffs (See DE-OS 42 03 632 and the counterpart U.S. Pat. No. 5,302,208).

An additional field of application is the corrosion-preventive coating of turbine blades, where, for instance, a layer 100 to 200 $\mu m$ thick of MCrAlY is applied and an additional heat-attenuating layer of 100 to 200 $\mu m$ of yttrium or stabilized $ZrO_2$ is added, so that the service of the turbine vanes is increased.

The main advantage of electron-beam coating lies in the high power density in the focal point of the electron beam, which may amount to as much as 1 $MW/cm^2$. Due to this high power density, a high surface temperature results, so that even materials with a high melting point can be vaporized. Typically the focal point surface area is smaller than 1 $cm^2$, so that only small vaporization zones are created. If therefore the electron beam is stationary or the speed with which it scans the surface to be vaporized is too low, the greater part of the electron beam energy goes into the depths of the material, which does not contribute to better vaporization.

The power distribution on the surface to be vaporized can be regulated with modern auxiliaries, whereby the layer thickness of the vapor-deposited material, for instance, can be optimized in a simple manner by changing the pattern of the beam scanning.

Layers applied by electron-beam vaporization are often less dense than comparable sputtered layers, and the properties of the layers can also be different. In order to improve the properties of the layers applied by means of electron-beam vaporization, additional plasma support can be added during the vapor-deposition process.

Due to the interaction of the electron beam with the residual gas particles, the pressure in a coating chamber and the spacing between the electron beam gun and the material to be vaporized, i.e., the beam length, must not exceed a prescribed value. For acceleration potentials of 20 to 50 kV, for instance, the pressure must not be greater than $10^{-2}$ mbar. The length of the electron beam should not exceed 1 m. If higher pressures or longer electron beam lengths are required, the acceleration potential should be increased.

A pressure increase at higher power levels can also be caused by the shield effect of material impurities, for instance, by $H_2O$ or water of crystallization. Furthermore, some oxides break up in part into metal and oxygen. The pressure increase can change the layer properties or defocus the electron beam. The vaporization materials should therefore be optimized with regard to the shield effect of impurities and water.

Electron-beam guns with a power of up to 1000 kW and with acceleration potentials of up to 160 kV are available. For coating purposes, electron-beam guns with powers of 150 to 300 kW and acceleration potentials of 35 kV are generally employed. The electron-beam deflection and focusing are generally carried out by means of magnetic coils. Both the beam focusing and the beam deflection can be easily controlled by varying the currents flowing in the magnetic coil.

In general, scanning frequencies of more than 10 kHz are used in electron-beam welding. For coating applications, on the other hand, the customary frequency is around 100 to 1000 Hz, this frequency relating to the fundamental frequency. If harmonics are present, frequencies of, for instance, 10 kHz are included. Scanning frequency is understood to mean the frequency at which an electron beam moves back and forth between, for instance, two points on the surface of a crucible.

In the controlling of a high-powered electron beam, essentially the following aspects must be paid attention to: the power supply to the gun, the guidance of the electron beam inside the gun and guidance of the electron beam over the process surfaces.

Several methods of controlling a high-power electron beam are already known, in which there is provided a special deflection system (DE 42 08 484 A1) with sensors for detecting the point of incidence of the electron beam on a melt (EP 0 184 680, DE 39 02 274 C2, EP 0 368 037, DE 35 38 857 A1). Also, deflection systems with more than one electron beam (U.S. 4,988,844) or electron-beam positioning regulators with magnetic field sensors (DE 35 32 888 C2) have been proposed.

Also known is a control of a high-power electron beam carried out by means of a microprocessor, in which conventional hardware is operated by software that is designed for uniform beam dispersion and great flexibility in the carrying out of melting instructions or formulas (M. Blum, A. Choudhury, F. Hugo, F. Knell, H. Scholz, M. Bähr: *Application of a New Fast EB-Gun Control System for Complex Melting Processes*, EB Conference, Reno/USA, Oct. 11–13, 1995). The essential characteristics of the high-frequency controlled electron-beam system are a thermal camera and measuring unit for the element concentration in the gas phase. This control system can be applied in a variety of ways, for instance, for hearth melting of titanium or in drop melting of tantalum. It is also suited for simultaneous control of several melting furnace, which can be equipped with up to 5 electron-beam guns. With it, it is also possible to implement an electron-beam process with precisely defined surface temperature distribution even for asymmetric melting arrangements, for instance, in horizontal drop melting, where on one side, the material to be melted is supplied via a water-cooled copper trough, or in another electron-beam arrangement, where a high input energy results at one side due to the overflowing melt material. The control is also accomplished in this known arrangement by means of a conventional PC, which is operated by way of a software based on WINDOWS®.

In a refinement of the above-described control of a high-power electron beam, an electron beam scanning and control system is used, with which the electron-beam scanning rate is directly controlled (M. Bähr, G. Hoffmann, R. Ludwig, G. Steiniger: New Scan and Control System (ESCOSYS™) for High-Power Electron Beam Techniques, Fifth International Conference on Plasma, Surface Engineering, Garmisch-Partenkirchen, September 1996). This control system, which relies on so-called "internal intelligence," has two essential characteristics. One characteristic pertains to error compensation. Here the behavior of the electron beam is first "trained," wherein one starts on a screen with low power. After this "training process," the frequency attenuation and deflection errors of the electron-beam gun are automatically compensated for. A circular pattern of the beam remains a circle and not, say, an ellipse in the crucible, even at different angles of incidence. The size of this circle remains constant even if the scanning frequency is changed. The deflection error compensation is performed by applying a 2×n-dimensional polynomial function. The frequency attenuation is compensated with respect to amplitude and phase-angle rotation by application of the Fast Fourier Transform algorithm. Thus, not only geometric patterns, but even very precise patterns are compensated. Nonetheless, the system operates with a frequency limitation of 10 kHz, which permits cycle frequencies of up to 1 kHz. This minimizes the necessity of a frequency-attenuation compensation. Alongside the aforementioned error compensation, the direct input of the power compensation for a given surface is essential. With the known system, vapor-deposited layers of great uniformity can be achieved at a high speed. For a reactive $Al_2O_3$ process, for instance, a coating speed of 10 m/sec is possible. Additional details on how the aforementioned deflection-error compensation and frequency-attenuation compensation are achieved were not given in the aforementioned presentation.

Starting from the above-described state of the art, it is an object of the present invention to make it possible to deflect the electron beam automatically and with error-compensation for preset scanning or power patterns.

SUMMARY OF THE INVENTION

The above and other objects of the invention can be achieved by the method for the operation of a high-power electron beam which is employed for the vaporization of materials in a crucible or the like, wherein one or more deflection units are provided for the electron beam and the electron beam is directed at essentially constant intensity onto the material to be vaporized. The electron beam can be guided at a specifiable velocity over various points of the surface of the material to be vaporized, according to selected geometrical coordinates of the point on the surface of the material to be melted. The selected geometrical coordinates $(x,y; r,\phi)$ are transformed into corrected deflection currents $(I_x,I_y; I_r,I_\phi)$ and are supplied to the corresponding deflection units.

It is a further feature of the invention that the geometrical power distribution of the electron beam on the surface of the material to be vaporized is established;

then the geometrical coordinates $(x,y; r,\phi)$ on the surface of the material to be vaporized corresponding to the power distribution are ascertained, and the ascertained geometrical coordinates $(x,y; r,\phi)$ are transformed into corrected deflection currents $(I_x,I_y; I_r,I_\phi)$ and supplied to the corresponding deflection coils.

A still further feature of the present invention resides in the method for the operation of the high-power electron beam as described above where the geometrical coordinates of the points on the surface of the material to be melted which the electron beam is to approach one after the other are selected, and the actual association of the geometrical coordinates $(x,y; r,\phi)$ to deflection-current coordinates $(I_x,I_y; I_r,I_\phi)$ is ascertained in the static operation of the electron beam;

the actual association of the geometrical coordinates $(x,y; r,\phi)$ to deflection-current coordinates $(I_x,I_y; I_r,I_\phi)$ is ascertained in the dynamic operation of the electron beam;

correction parameters are ascertained which determine the deviations between ideal current coordinates $(I_{xi},I_{yi}; I_{ri},I_{\phi i})$ associated with the geometrical coordinates $(x,y; r,\phi)$ and the actual current coordinates $(I_x,I_y; I_r,I_\phi)$; and the ideal current coordinates are corrected in order to control the electron beam with the aid of the ascertained correction parameters Still further, in accordance with the present invention the corrected currents for a point (x',y') of the surface to be vaporized that were not taken into account in the training process are determined from the equation $$\text{current amplitude}_{x',y'} = \sum_{i,j=0}^{n} a_{i,j} \cdot (\text{spatial coordinate } x)^i \cdot (\text{spatial coordinate } y)^j$$

(spatial coordinate x)$^i$·(spatial coordinate y)$^j$
wherein
$\alpha(I,\omega=0)$ is the deflection angle for direct-current deflection of the electron beam and
$\alpha(I,\omega=1\cdot\omega_T)$ is the deflection angle for alternating-current deflection of the electron beam.

Yet another feature of the invention is that prescribed geometrical points on the surface of the material to be vaporized are associated with electric power of the electron beam striking it, wherein the power is determined by the intensity and the velocity of the electron beam; and the coordinates for an ideal geometrical motion pattern of the electron beam are ascertained, which guarantees that the geometrical points are supplied with the prescribed powers of the electron beam.

The advantage achieved with the invention is, in particular, that the geometrical path of the electron beam or the power density produced by it on the predetermined melt surface is freely selectable and error-compensated. The user need no longer take into account errors which may occur and can make the input directly in spatial coordinates. Additionally, the user can define the power distribution directly and need no longer, as previously, ascertain the power distribution only experimentally by a suitable combination of geometrical deflection patterns. It is, moreover, possible with the invention to use a closed control loop. If, for instance, the vaporization rate is measured in situ in a vaporization process and a new power distribution is generated from it by means of a control algorithm in order, for instance, to achieve a more uniform coating, then such a control loop can readjust very precisely if an error correction was previously performed. If these errors are not corrected, residual errors remain even for a closed control loop.

For melting, it is possible with the aid of the invention, for instance, for the temperature distribution on a crucible or ingot to be controlled or regulated if an appropriate measuring system is available. In this way, material structures and undesired vaporization losses of alloy components can be better optimized.

The invention involves a passive system, that is to say, no measurement of the point of incidence of the electron beam on the material to be melted is undertaken. Rather, the system knows the points of incidence through a recognition ("teach-in") performed one time at the start of the melting process. The invention can, however, also be combined with automatic measurement systems, which measure the points of incidence of the electron beam directly. In the implementation of the passive system, a deflection pattern is first defined in spatial coordinates and interim-stored in a memory. The deflection speed of the electron beam is calculated from the specified deflection frequency of the electron beam and the distances between the defined points on the surface of the material to be melted. A special algorithm, which, in particular, contains an error-correction algorithm, then transforms the deflection pattern defined in spatial coordinates into such a deflection pattern that is defined in current values for the deflection coils. Here, too, the deflection speed results from the additionally specified frequency. The current pattern thus obtained can then be supplied directly to a current amplifier which drives the magnetic deflection coils and thus deflects the electron beam magnetically. The frequency-dependent attenuations arising from eddy currents and the frequency-dependent nonlinear distortions in the current amplifier, as well as any other nonlinearity in the frequency response between pulse output and electron beam is not taken into account in this regard.

BRIEF DESCRIPTION OF DRAWINGS

The present invention will be further understood from the following drawings, wherein.

DETAILED DESCRIPTION OF INVENTION

The present invention will now be described in further detail.

Figure 1:
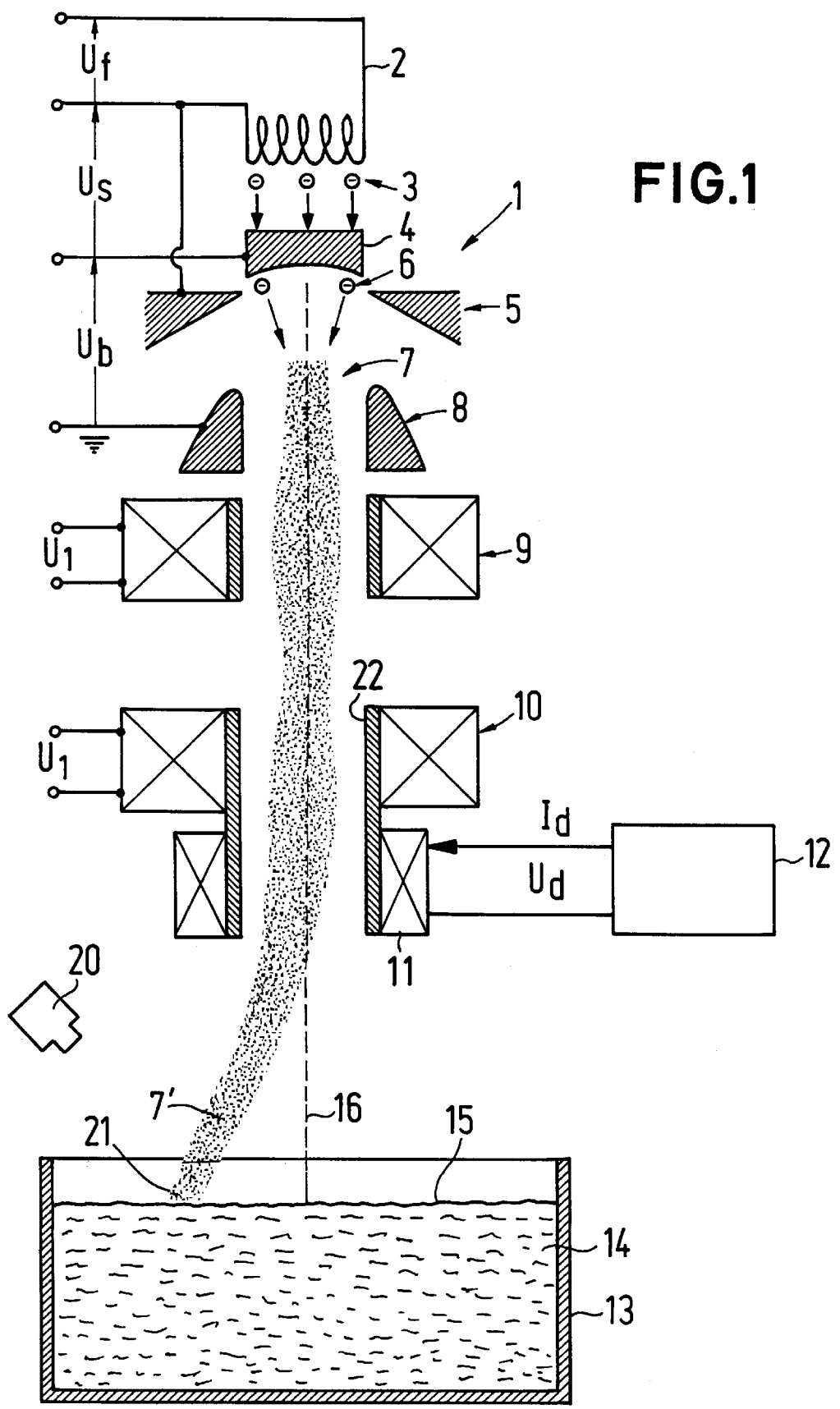
FIG. 1 is a perspective view of a schematic representation of an electron-beam melting or electron-beam vaporization device with deflectable electron beam.

In FIG. 1, the principle of the high-power electron-beam gun 1 is schematically represented. A heating filament that is connected to a voltage $U_f$ and emits electrons 3 is labeled 2. Below the filament 2, a stationary and usually block-shaped cathode 4 is arranged. This is heated by an electron current to the point where this block 4 itself emits electrons 6. A high voltage $U_b$, by which the electrons 6 are accelerated, is present between the block 4 and an anode 8. A Wehnelt cylinder 5 influences the electrostatic field in such a way that the electrons are focused into a hole of the anode 8 and thus a concentrated electron beam 7 is generated. This electron beam is further concentrated by means of magnetic lenses 9,10. A magnetic deflection unit 11 that is supplied by a current $I_d$ which comes from the power supply 12. This power supply 12 can supply direct or alternating current, the amplitude and/or frequency of the current being variable.

Beneath the electron-beam gun 1, a crucible 13, in which metal or a metal alloy 14 is located, is shown in cross section. The deflected electron beam 7', which has an angle of deflection a to the horizontal axis 16 in FIG. 1, strikes the surface 15 of this metal 14 at a point 21.

A thermal camera 20 makes it possible to detect the temperature distribution on the surface 15 of the metal 14.

Figure 2:
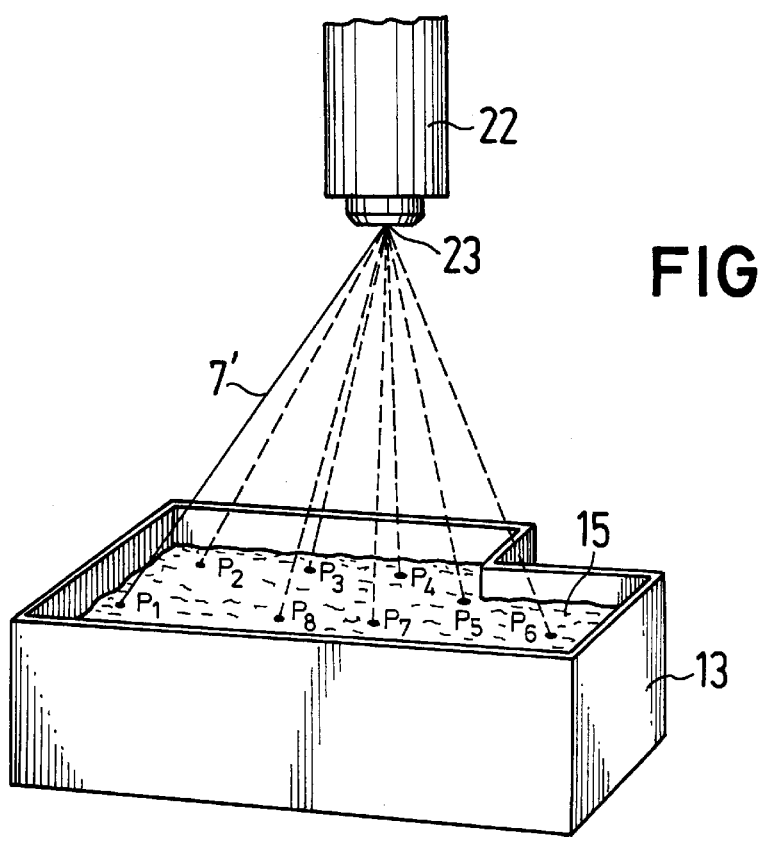
FIG. 2 is a perspective view of a melting crucible, over the surface of which a deflectable electron beam is guided.

Only the lower part 22 of the electron-beam gun 1 is shown in FIG. 2, wherein the deflection unit 11 is not separately illustrated; it is located inside part 22. The crucible 13 and the metal surface 15 are shown in perspective.

One recognizes here that the electron beam 7', shown here only as a line, can be deflected in such a manner that it passes over the entire surface 15. Individual points of incidence of the electron beam 7' on the surface 15 are labeled $P_1$–$P_8$.

The points of incidence $P_1$–$P_8$ can be defined on the surface 15 with the aid of x,y coordinates or polar coordinates. If the length of the electron beam 7' is included in the establishment of the point coordinates, then spherical coordinates are a logical choice. Here the distance 23–$P_1$ establishes the distance of the electron beam from the exit from the electron-beam gun to the point $P_1$, while a first angle α, not shown, designates the deviation of the beam from the central axis and a second angle β, likewise not shown, designates the angle of rotation in, say, the clockwise direction. As is known from the technology of television tubes, an electron beam can be deflected to a certain point if certain currents flow through the x,y deflection coils. There is thus an unambiguous association between the current through the x,y deflection coils and the point of incidence of the electron beam 7'.

This fixed association of spatial coordinates and ideal current coordinates applies however only to a stationary deflected electron beam 7', that is to say, only if the electron beam 7' does not move and if no disturbances appear. If the electron-beam gun is, for instance, set up at an incline to the crucible 13 or if additional interfering electrical or magnetic fields appear at the crucible 13, the electron beam 7' cannot reach the prescribed points $P_1$–$P_8$ even if its deflection units are supplied with the currents that are associated with these points under ideal conditions. In vaporization processes, however, the electron-beam gun is generally not positioned at right angles and centered with respect to the crucible, in order to minimize internal damage to the gun tube. Thereby, for instance, a square deflection pattern on the surface 15 is distorted into a bent trapezoidal deflection pattern, or a deflection pattern input as a circle becomes an ellipse. In order to generate a square or a circle on the material to be evaporated, despite this, corrections must consequently be made to the ideal current parameters, that is to say, the deflection units must not be supplied with the same currents as in the case of an exactly symmetrical orientation of the electron beam and purely inductive deflection units.

In the vaporization processes described here, the intensity of the electron beam 7' is always constant or can be varied only slowly. The power input into the surface 15 by the beam 7' is determined by the speed with which it moves from one point to the next. One speaks, for instance, of the dwell time of the electron beam on a point of the surface, because the beam is not exactly a point and thus remains with its diameter on a point for a certain time.

In order to determine the aforementioned static deflection error and its influence, the deviation of the actual deflection from an ideal deflection must be established. The ideal deflection can be easily determined by calculation, but not the actual deflection. This is therefore determined by means of a training process.

Figure 3:
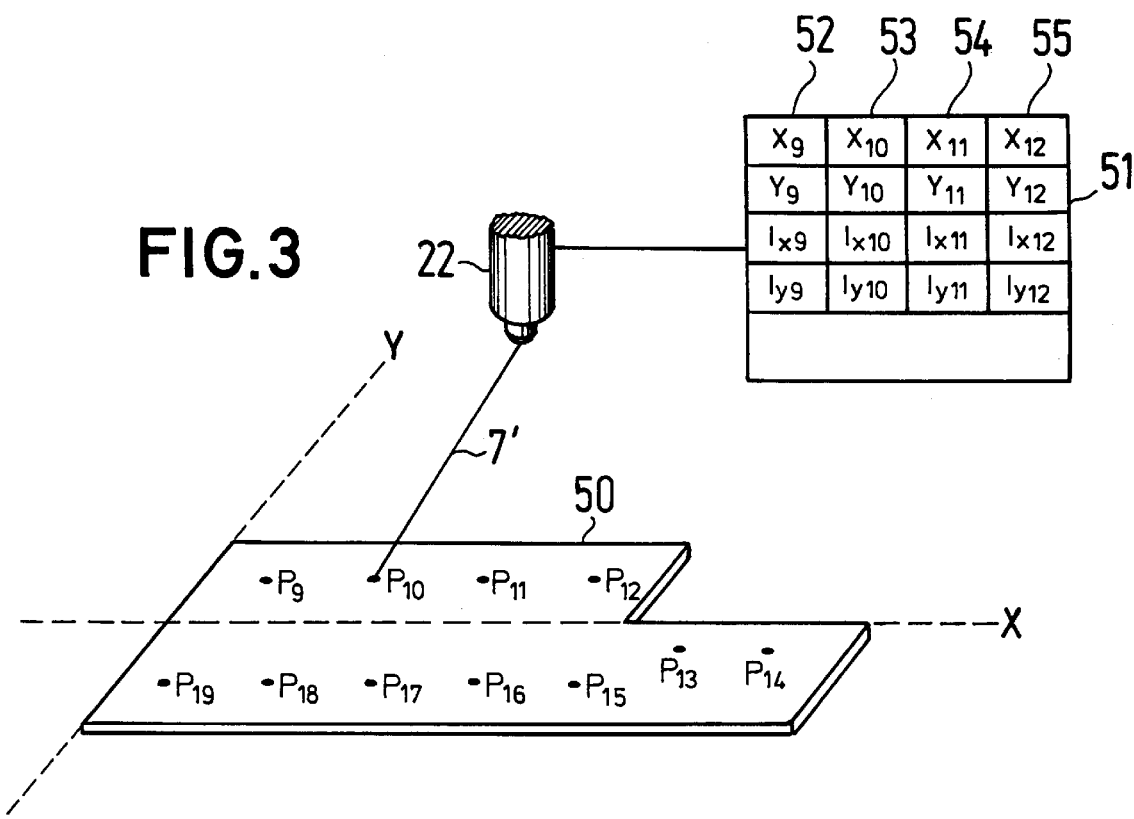
FIG. 3 is a perspective view of a screen plate that is arranged above a crucible for calibration purposes.

FIG. 3 shows a sketch to explain the training (teach-in) process for a correction of deflection errors. Such deflection errors can, as already mentioned, be provoked by a slanted position of the electron gun relative to the central crucible axis or by additional magnetic fields on the crucible. The correction of such deflection errors is also called a static correction because it also must be undertaken with a non-moving electron beam. The electron-beam gun 22 and the electron beam 7' are only schematically shown in FIG. 3. Essential to the training or teach-in process is a marker sheet 50 that is arranged above a crucible, not shown and has the marker points $P_9$–$P_{19}$. These marker points are targeted manually and individually by varying the deflection currents for the electron beam 7'.

If the electron beam 7' assumes the position shown in FIG. 3, the known spatial coordinates $x_{10}, y_{10}$ for $P_{10}$ are stored in a memory 51. Associated with these spatial coordinates are current coordinates $I_{x10}, I_{y10}$, that is, the current for the x and y deflections which cause the electron beam 7' to assume the position shown in FIG. 3. These are the actual flowing currents, which differ from the ideal currents associated with an x,y coordinate and already contain an error correction. The amplitudes of the actually flowing currents $I_{x10}, I_{y10}$ which are necessary in order to reach a prescribed point, are likewise stored in the memory 51 and associated with the spatial coordinates of $P_{10}$. The same procedure is now followed for the spatial coordinates $P_9$ and $P_{11}$–$P_{19}$ so that ultimately every point $P_9$–$P_{19}$ in the memory is associated with certain deflection currents $I_{x9}, I_{y9} \ldots I_{x19}, I_{y19}$.

If one now wants to ensure that the electron beam hits the points $P_9$–$P_{19}$ exactly, despite the existing disruption factors, one need only supply the current amplitudes associated with these points and ascertained by the training procedure to the corresponding x,y deflection units. Although direct currents are preferably employed in the training process as deflection currents, the correction factors obtained also apply to the amplitudes of alternating currents.

By the association of the spatial x,y coordinates with the respective current coordinates, a transformation is performed in a certain sense from the space domain of the metal surface to the current domain of the deflection coils. These current coordinates involve, as already mentioned, the actual current amplitudes that must flow in order for the electron beam to approach a prescribed x,y point. It would also be possible, however, to assign to each x,y point an ideal current coordinate and to the latter in turn a correction factor, which could be expressed by $I_{ideal}/I_{actual}$.

Figure 4A:
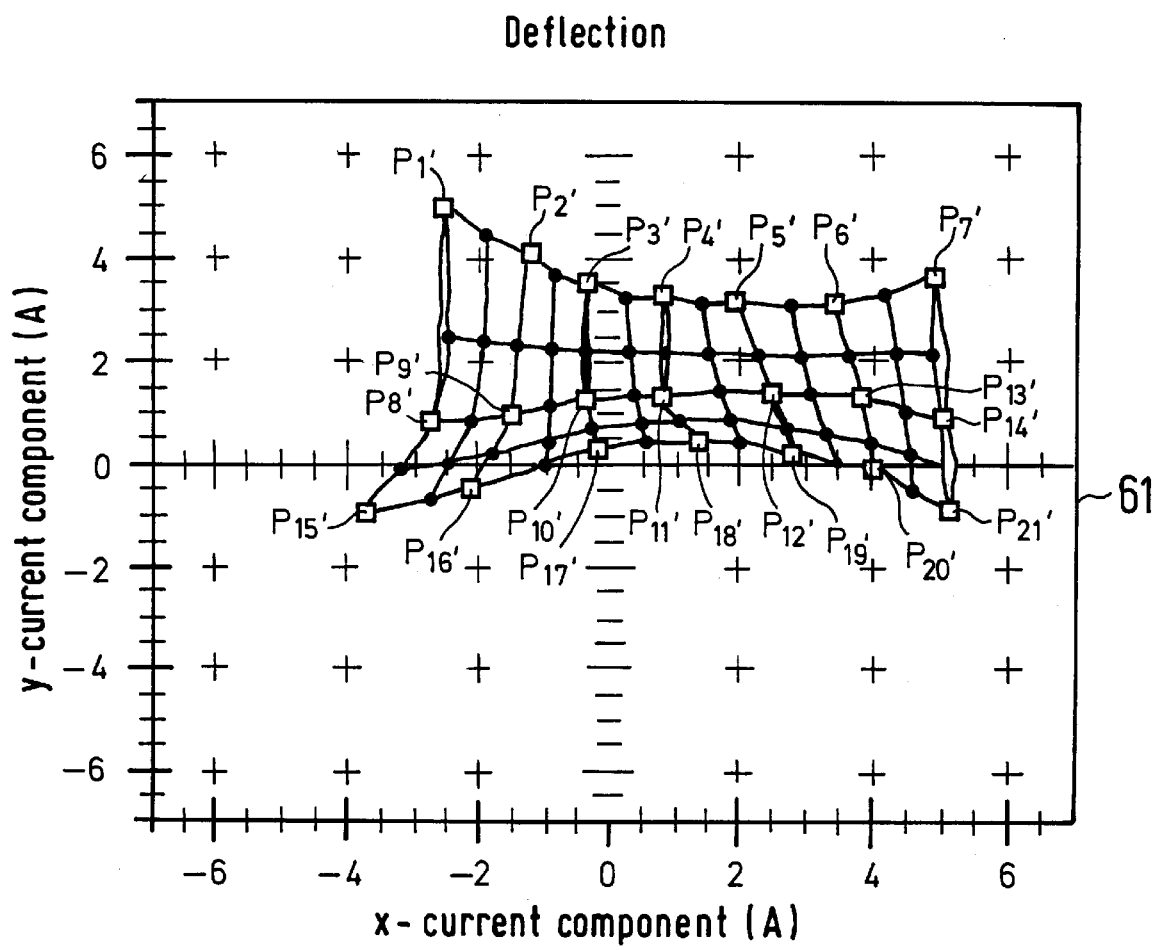
FIG. 4a and 4b are graphical representations of the actual x,y current component in order to achieve a specified pattern.
Figure 4B:
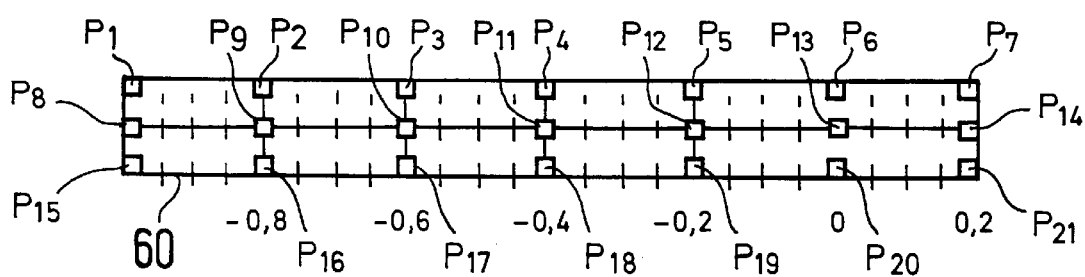

The result of the training process for a rectangular crucible 60 is illustrated in FIG. 4a and 4b. Here one can recognize a crucible 60 with the points $P_1$–$P_{22}$ which are to be approached exactly. In order to achieve this exact approaching by means of an electron beam that is subject to the aforementioned static deflection error, the currents for the x and y coordinates must have the values that are shown in 61. These currents labeled by the points $P_1'$–$P_{22}'$ are corrected and do not lie on a rectangle, but rather on a distorted trapezoid.

The deflection coils must, as designated by 61, be subjected to the corrected current amplitudes in order for the electron beam ultimately to strike the points $P_1 \ldots P_{22}$ of the crucible.

The point grid shown for the crucible 60, which is sufficient for the teach-in process, is nonetheless relatively coarse for the operation. In order to be able to apply the correct current to the deflection coils even for the intermediate areas, interpolation methods can be employed. A particularly suitable method for obtaining a greater point density than shown at 60 in FIG. 4 exists in the method of least squares. In this method, a compensation polynomial $$y = \sum_{i=0}^{n} a_i x^i$$

is determined for n measured value pairs $x_i, y_i$. Serving as a compensation criterion is the sum of the squared deviations of the individual measurement points from the compensation polynomial, which should be minimal (H. Frohner, E. Ueckert: Grundlagen der elektrischen Meßtechnik (Foundations of electrical metrology), 1984, pp. 208, 209). In this compensation process the respective currents, that is to say, also the currents for the intermediate positions between the points $P_1 \ldots P_{22}$, are ascertained via the equations $$\text{current amplitude}_k = \sum_{i,j=0}^{n,m} a_{i,j,k} \cdot (\text{spatial coordinate } x)^i \cdot$$

$$(\text{spatial coordinate } y)^j$$

(spatial coordinate x)$^i$·(spatial coordinate y)$^j$
wherein
k=x',y' and
$a_{i,j,k}$=the coefficients that were determined in the course of the training procedure at the points $P_1 \ldots P_{22}$.

In order to correct the aforementioned errors for all coordinates, the deflection errors are thus calculated by way of a two-dimensional nth order polynomial, that is to say, the current amplitude $(I_x, I_y)$ can be calculated by way of this polynomial for any arbitrary point (x,y) in a plane.

By this process, even the places not measured during the teach-in process are transformed from the space domain into the current domain.

After the static deflection correction has been performed, a dynamic frequency correction is undertaken, i.e., a corrected alternating current is determined from a purely sinusoidal alternating current applied to the deflection coils. This alternating current correction is necessary because frequency errors occur in practical operation. What the frequency errors involve is explained below on the basis of FIG. 5.

Figure 5:
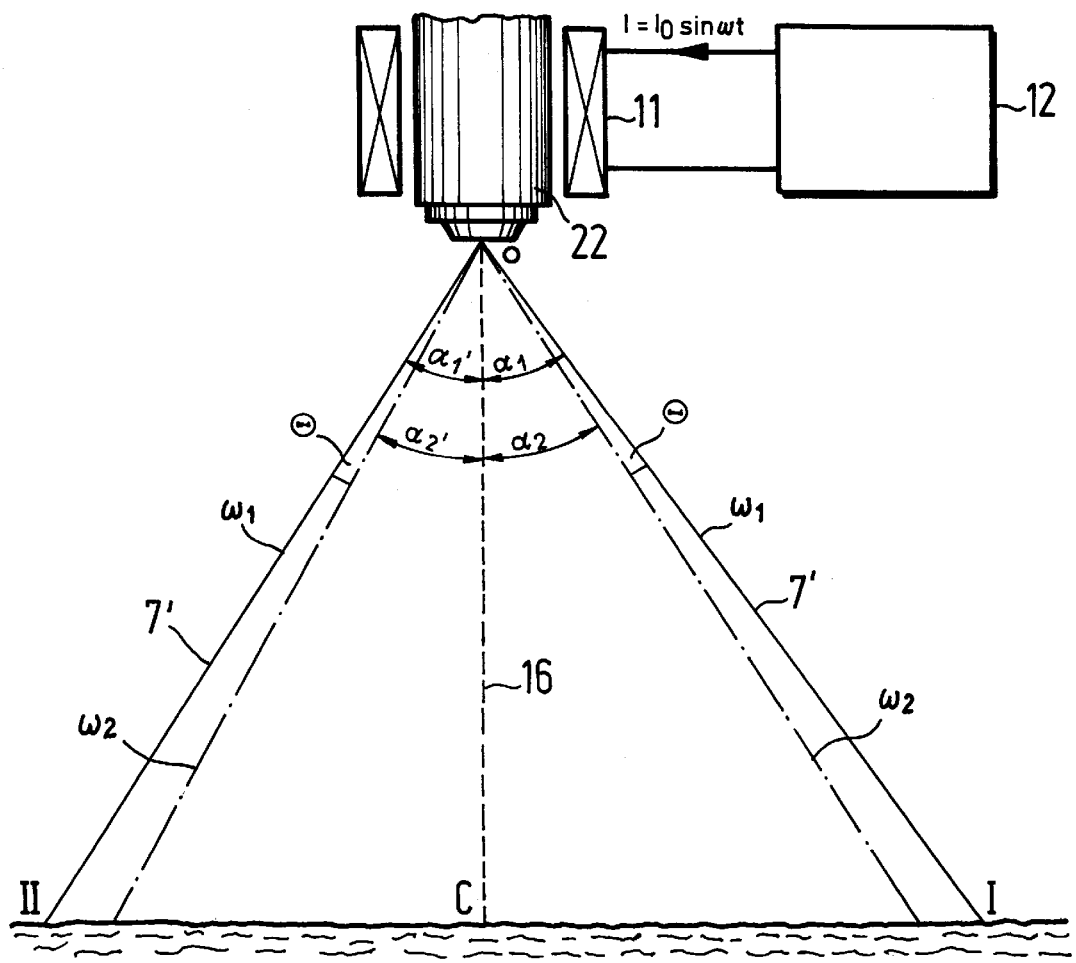
FIG. 5 is a schematic representation for explanation of the growing deflection error of an electron beam with increasing deflection frequency.

In FIG. 5, which shows a one-dimensional motion of an electron beam, a purely sinusoidal deflection of the electron beam 7' is illustrated. In this case, the deflection of the electron beam 7' is determined by the amplitude and the frequency of the current $I=I_0 \cdot \sin \omega t$ flowing through the deflection unit, which results because of the voltage $U=U_0 \cdot \sin \omega t$ supplied by the power supply 12. For a predetermined current intensity $I_0$ and a predetermined circular alternating-current frequency $\omega_1$, the electron beam 7' moves from a first position I to a second position II and back again, specifically in the cycle frequency of the respective alternating-current frequency. The electron beam 7' thus describes a straight line drawn between I and II on the surface. The deflection angle $\alpha_1$ to the right of the central axis 16 corresponds in this case to the deflection angle $\alpha_1'$ to the left of the central axis 16. Both angles $\alpha_1, \alpha_1'$ are determined by the current intensity of the respective alternating current flowing through the deflection unit 11. If the alternating-current frequency is increased with a constant current intensity, then theoretically the electron beam 7' will continue to oscillate between the positions I and II, but at a higher frequency.

In practice, however, the deflection angles $\alpha_1$ and $\alpha_1'$, respectively, are dependent on the frequency because a so-called frequency attenuation occurs. The frequency-dependent attenuation comes about essentially because of eddy-current losses in the magnetic deflection system. Since a deflection system does not consist only of a coil, but also contains iron, frequency-dependent reactions on the coil current result from the eddy currents flowing in the iron.

Additionally, a nonlinear frequency characteristic of the amplifier supplying the coils can, in particular, lead to a frequency dependence of the coil current. Ultimately, this means that for an equal current intensity but an increased frequency $\omega_2$, the deflection angles $\alpha_2$ and $\alpha_2'$ are smaller than $\alpha_1$ and $\alpha_1'$. The difference $\alpha_1-\alpha_2$ between these two angles is also called the phase shift $\theta$ of the frequency attenuation. This frequency attenuation $\theta$ is a function of the alternating-current frequency, i.e., $\theta=f(\omega)$.

A phase shift $\theta$ can also occur when the deflection systems for the x and y directions are different. This phase shift $\theta$ signifies a time-domain offset of the currents in the respective deflection coils responsible for the x and y deflection directions.

Figure 6A:
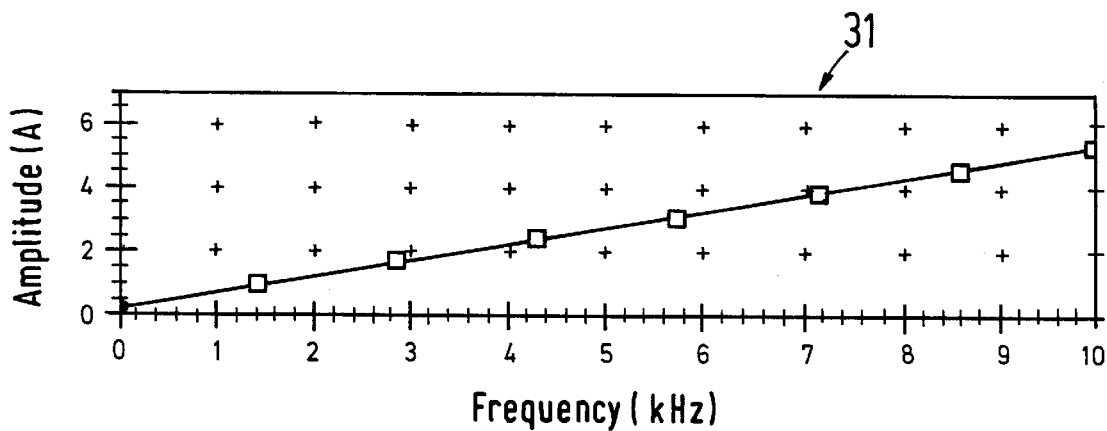
FIG. 6a and 6b are representations of the frequency-attenuation compensation, in which the current amplitudes are increased radially and tangentially with increasing frequency.
Figure 6B:
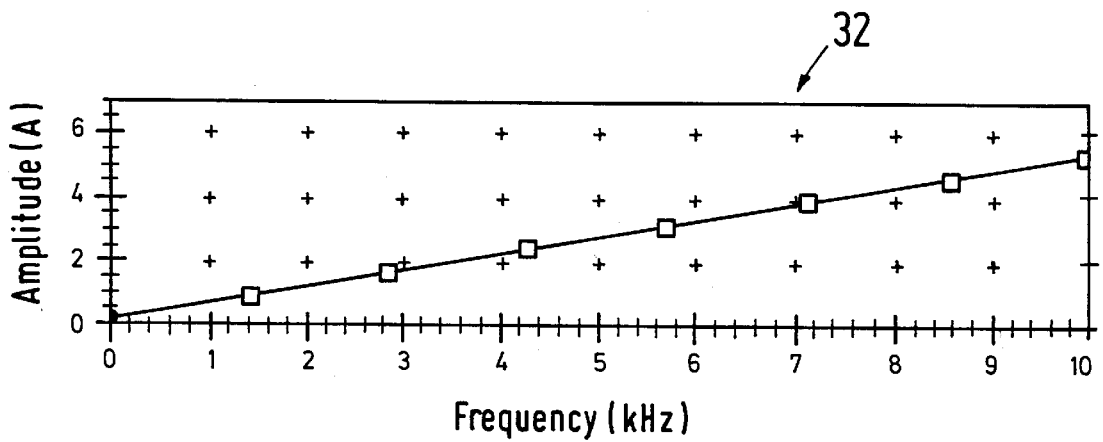

In the upper representation 31 in FIG. 6a it is shown how the current amplitude of a deflection unit in the x direction must change with increasing frequency in order to correctly approach a certain point with the electron beam. The representation 32 in FIG. 6b shows, on the other hand, how the amplitude in the y direction must increase with increasing frequency so that a prescribed point can be correctly approached. In each case, the amplitude must be increased in order to compensate for the attenuation factor which appears with increasing frequency. The aforementioned functional connection amplitude=$f(\omega)$ can be determined experimentally for different frequencies and learned, that is to say, stored in a memory. For these purposes, by way of example, six different frequencies that must be detected during the training are sufficient. In contrast to the training of static deflection errors, the electron beam need not be directed to different points $P_1 \ldots P_{19}$; rather, it is sufficient, considering one coordinate, if it oscillates between two points, for instance, $P_9$ and $P_{10}$. For each of the six frequencies the amplitude is then changed sufficiently that the electron beam reaches the points $P_9$ and $P_{10}$.

In practice, this teach-in process is performed for two coordinates. In this regard, a sinusoidal current profile is specified for the two deflection units with the frequency being varied. If a frequency attenuation occurs, the amplitude of an imaged ellipse or of an imaged circle or a line decreases. The current amplitudes for the x and y directions are now readjusted such that the prescribed deflection amplitude is again achieved.

Due to the frequency attenuations, however, not only the amplitudes of the currents supplying the deflection units must be changed, but a correction of the curve shape must also take place. If a purely sinusoidal current is fed to the deflection units from a voltage source, then a distortion of the sinusoidal form results because of dynamic errors, i.e., the current deflecting the electron beam does not have a pure sinusoidal form, but rather a sinusoidal form with superimposed harmonics. In order to be able to reproduce this distorted sinusoidal curve, a Fourier transform is carried out. With the aid of the Fourier transform process, a time-dependent function can be converted into a frequency-dependent Fourier transform and vice versa. The Fourier transform thus represents an operation that generates a function in the frequency domain from a function in the time domain, thus bringing about a transition from the time to the frequency domain and vice versa. If a current running over time that is sent through the deflection units is Fourier-transformed, then several frequencies with different amplitudes result.

Figure 6C:
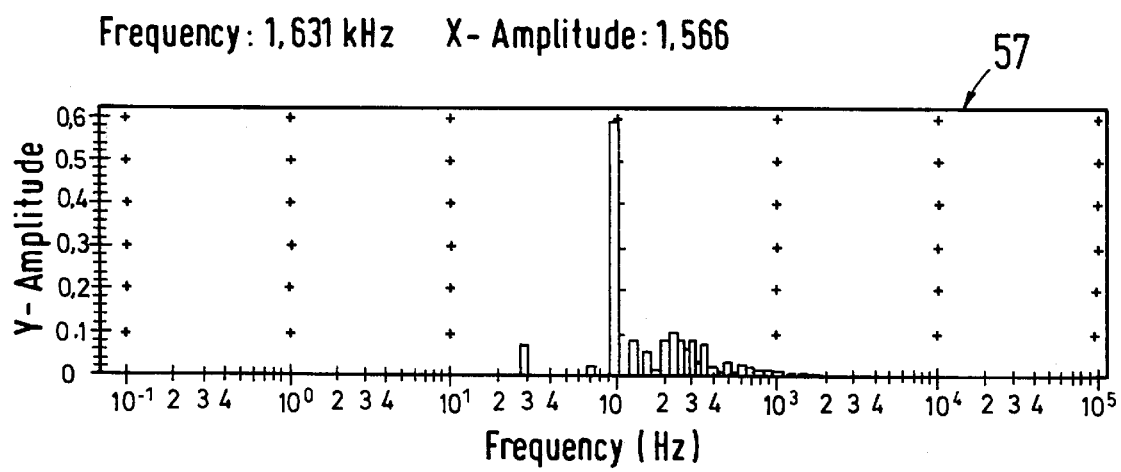
FIG. 6c and 6d are the frequency spectrums of the x and y current components of a corrected deflection-current profile.
Figure 6D:
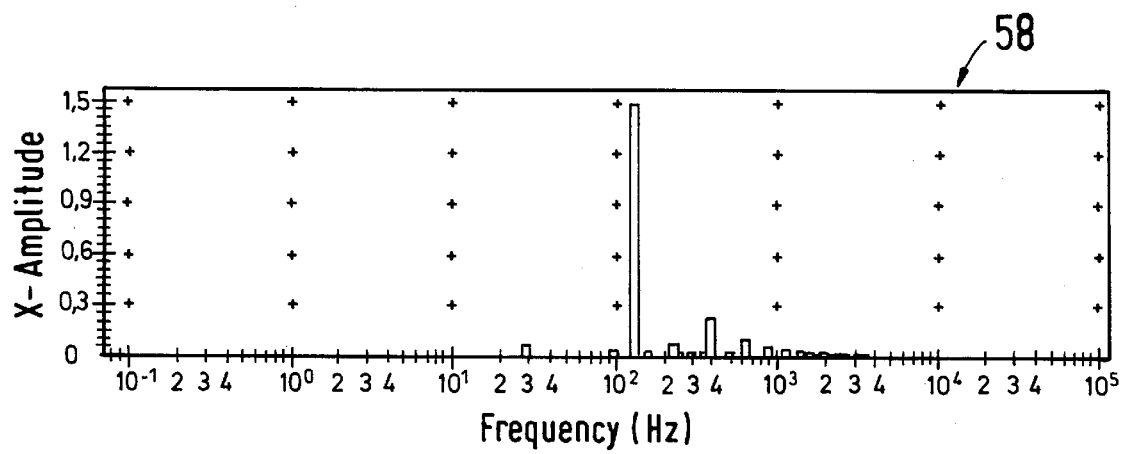

In the upper part 57 in FIG. 6c, the amplitudes of the Fourier coefficients for the y component of the deflection current of an electron beam are presented, while in the lower part 58 in FIG. 6d, the Fourier coefficients for the x component of the deflection current are presented.

For a transformation from the time to the frequency domain, the use of the Fast Fourier Transform (FFT) is always to be recommended if a digital computer is being employed.

The Fast Fourier Transform (FFT) is an algorithm for the calculation of Fourier coefficients which requires considerably less calculation effort than the conventional calculation methods (cf. J. W. Cooley and J. W. Tukey, "An algorithm for the machine calculation of complex Fourier series," Math. of Computers, Vol. 19, pp. 297–301, April, 1965).

The FFT involves a method for the efficient calculation of the Discrete Fourier Transform (DFT) of time sequences, that is to say, discrete data patterns. The DFT is an independent transformation like the Fourier integral transformation or the Fourier series transformation, for instance.

What the Fourier transform means for continuous waves is what the DFT means for pulse samples taken according to the sampling theorem, known as Nyquist samples. Thereby the DFT is particularly useful for power spectrum analysis and for filter simulation by means of digital computers.

No matter whether the normal or the Fast Fourier Transform is performed, it is of significance for the present invention that a correction takes place in the frequency domain. This means that during the teach-in for certain specified frequencies those (distorted) currents which generate the desired scanning pattern on the surface of the material to be vaporized are subjected to a Fourier transform.

This is shown in FIG. 6c and 6d for the frequency 1.631 kHz and, specifically, separately for the x and y components of the current. The x component is presented in field 57 while the y component is presented in field 58. If a purely sinusoidal frequency is supplied to the deflection units, then it must be corrected in terms of current in order to generate the desired deflection pattern. The correction is done here in that the sinusoidal profile of the frequency is Fourier-transformed and the Fourier coefficients are corrected by means of FFT corresponding to the values determined in the teach-in process.

The corrected current profile I'(ωt) is then obtained by inverse transformation.

$$I(\omega_T t) = \sum_l F_l \cdot e^{l \cdot i \omega_T t}$$

$$I'(\omega_T t) = \sum_l F'_l \cdot e^{l \cdot i \omega_T t - i \theta(l \cdot \omega_T)}$$

$$F'_l = F_l \cdot \frac{\alpha(l, \omega = 0)}{\alpha(l, \omega = l \cdot \omega_T)}$$

wherein

I=ideal current of the deflection unit

F=Fourier amplitude l=integer number

I'=corrected current

F'=corrected Fourier amplitude

α=deflection of the electron beam.

If one wishes to direct the electron beam deliberately by means of an alternating current onto a point of the surface 15, it is thus not sufficient merely to adjust the current intensity such that a corresponding intensity of the direct current would achieve the desired deflection; rather, the current intensity of the alternating current must be adjusted such that the phase or angle error is compensated. These considerations applying to purely alternating current also apply in principle to pulsed direct currents.

In addition to the frequency attenuation, i.e., the attenuation of the deflection amplitude of the electron beam, a phase-angle rotation can also occur as already mentioned above. If the deflection system is not symmetrical in the x and y directions, for instance, because of differing pole piece dimensions, a phase shift between these two direction occurs. This phase shift or phase error is also corrected according to the invention, and specifically, in the following way.

For different frequencies, a sinusoidal current profile is again fed to the deflection, so that a diagonally running line results on the crucible. If a phase-angle rotation now occurs, an ellipse results from this line. A phase difference is then adjusted manually at different frequencies so that a line again becomes visible. When one has done this for several measurement points, six, for instance, one can again calculate a necessary phase shift for each arbitrary frequency with a polynomial approximation.

During training or the teach-in, only perhaps six frequencies are Fourier transformed. If one wishes to determine the corrected current profiles through the deflection coils for the other frequencies, then, as already indicated above, an approximation procedure must be utilized. This consists, for instance, in calculating the correction factor for an arbitrary frequency $\omega_q$ according to the following formula:

$$\frac{\alpha(l, \omega = 0)}{\alpha(l, \omega = \omega_q)} = \sum_{i=0}^{n} a_{i,l} \cdot \omega_q^i$$

wherein l=x or y $a_{i,l}$=coefficients that were determined by the teach-in procedure.

Figure 7:
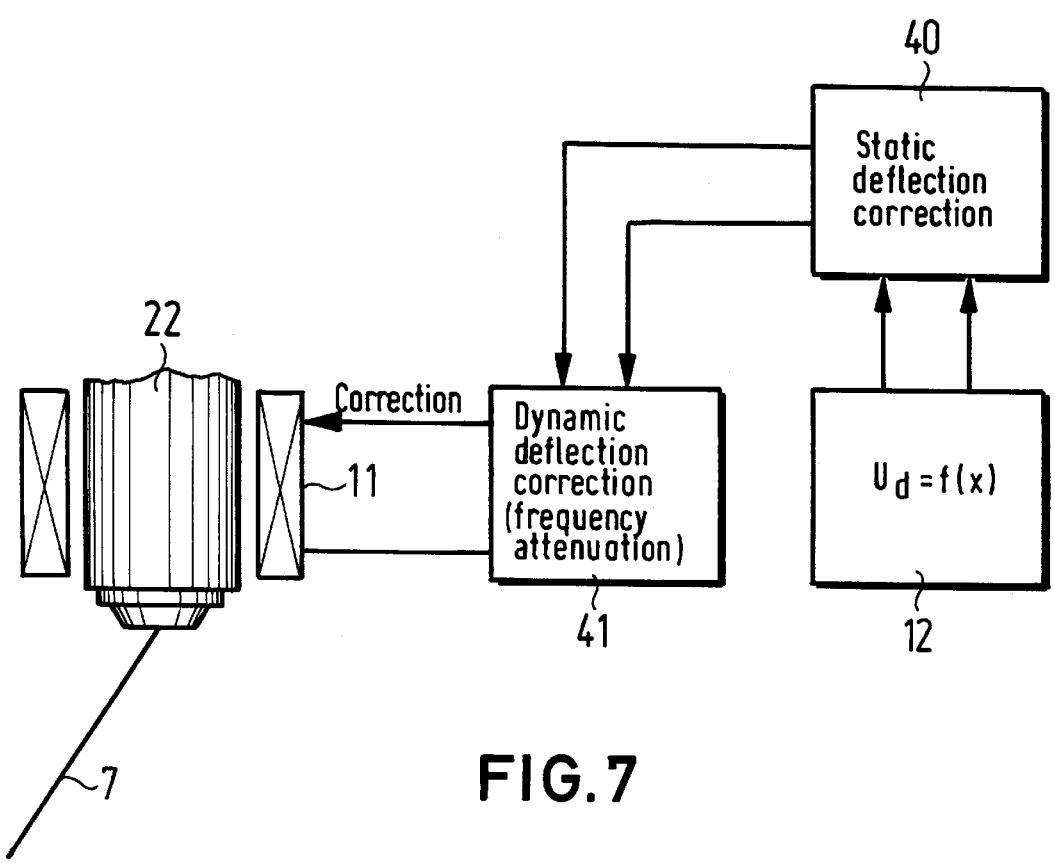
FIG. 7 is a schematic representation of an arrangement in which static and dynamic correction of the deflection errors is undertaken.

In FIG. 7, a schematic representation of the conduct of the invention for an x deflection is shown. The voltage supplied by a power supply 12 is labeled $U_d$=f(x) here, which is intended to express the fact that the current can have an arbitrary form, i.e., that it can be a direct or an alternating current, and is provided for the supply of the x-deflection coil.

This current $I_d$=f(t) from the current source 12 is subjected by means of an appropriate unit in block 40 to the static deflection error correction described above. The result ensuing from this is subjected according to the above-explained process to a dynamic frequency-attenuation correction in a unit 41. The current corrected in this manner has the effect that the electron beam 7 strikes exactly the x coordinate that it is supposed to strike.

As results from the above, geometric x,y data designating the point to be covered by the electron beam is first specified for the invention. This may, for instance, be a circular or ellipsoidal surface. Then these coordinates are associated with corrected current values which correct the deflection errors. In place of the input of spatial coordinates into a computer it is also possible to input directly the power distribution that an electron beam should generate on a surface. The current profile thus obtained is subsequently transformed for the time domain into the frequency domain and corrected in this frequency domain by correcting the amplitudes of the individual harmonics, that is to say, the amplitudes of the higher frequency components are increased relatively more strongly than the amplitudes of the lower frequency components. Thereupon, the corrected frequency spectrum is transformed back into the time domain, so that a corrected current profile results.

Static and dynamic error correction represents a precondition for this direct input of power distributions. If an error correction was not undertaken, the specified power distribution cannot be reproduced either.

The specification and performance of the power distribution will be dealt with further below.

Figure 8:
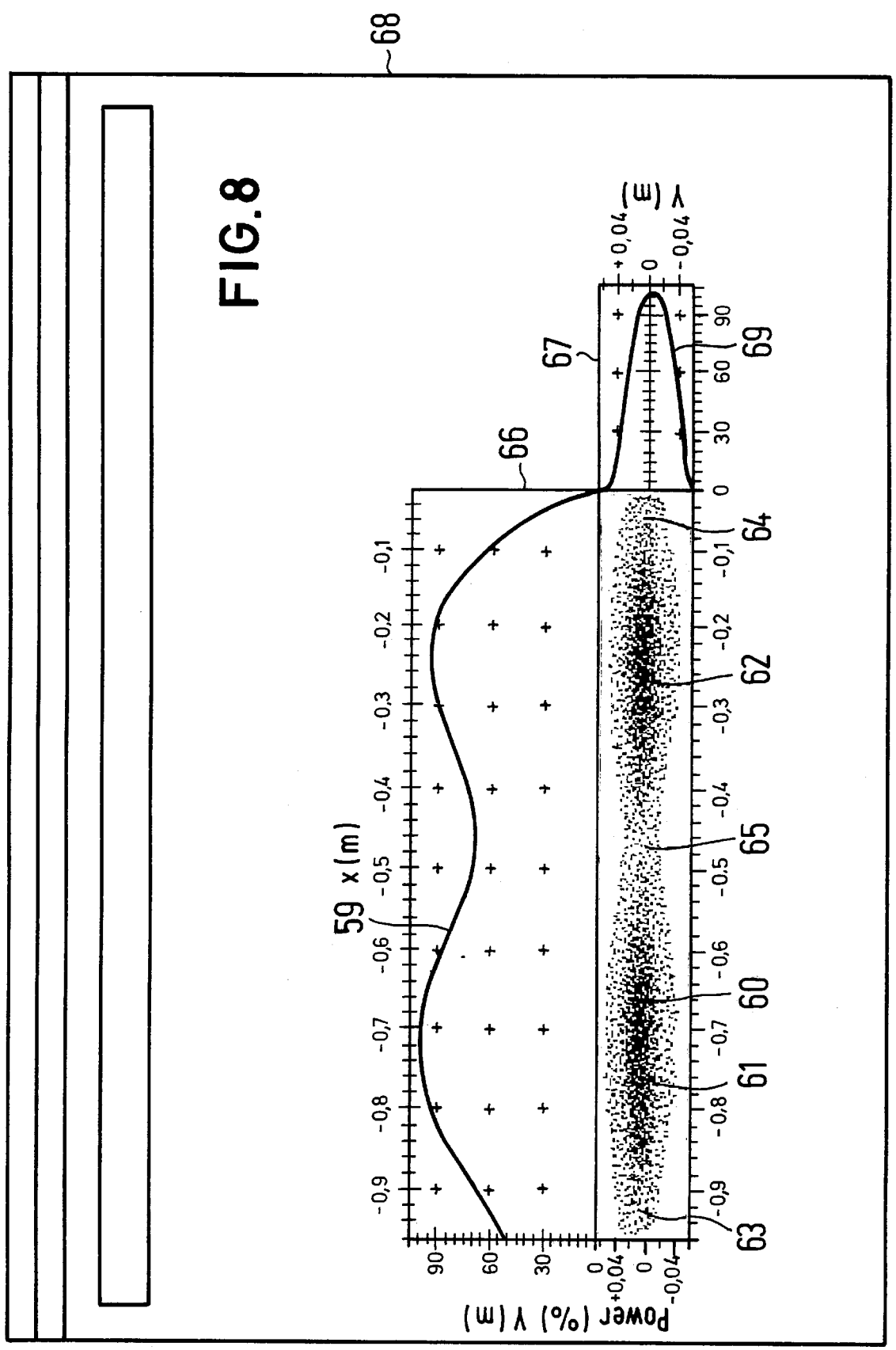
FIG. 8 is a specified power distribution for a rectangular crucible.

A rectangular crucible 60 is shown in FIG. 8, in which the deeply darkened fields 61,62 represent a large electron-beam impact power, while the less strongly darkened fields 63,64, 65 represent a smaller electron-beam impact power.

The crucible 60 has, for instance, a length of one meter and width of approximately 10 cm. The crucible 60 is shown together with the grid fields 66,67 on a computer monitor screen 68. The desired power distribution 68 in the x direction and the desired power distribution 69 in the y direction can be input with the aid of a light pen or the like.

Figure 9:
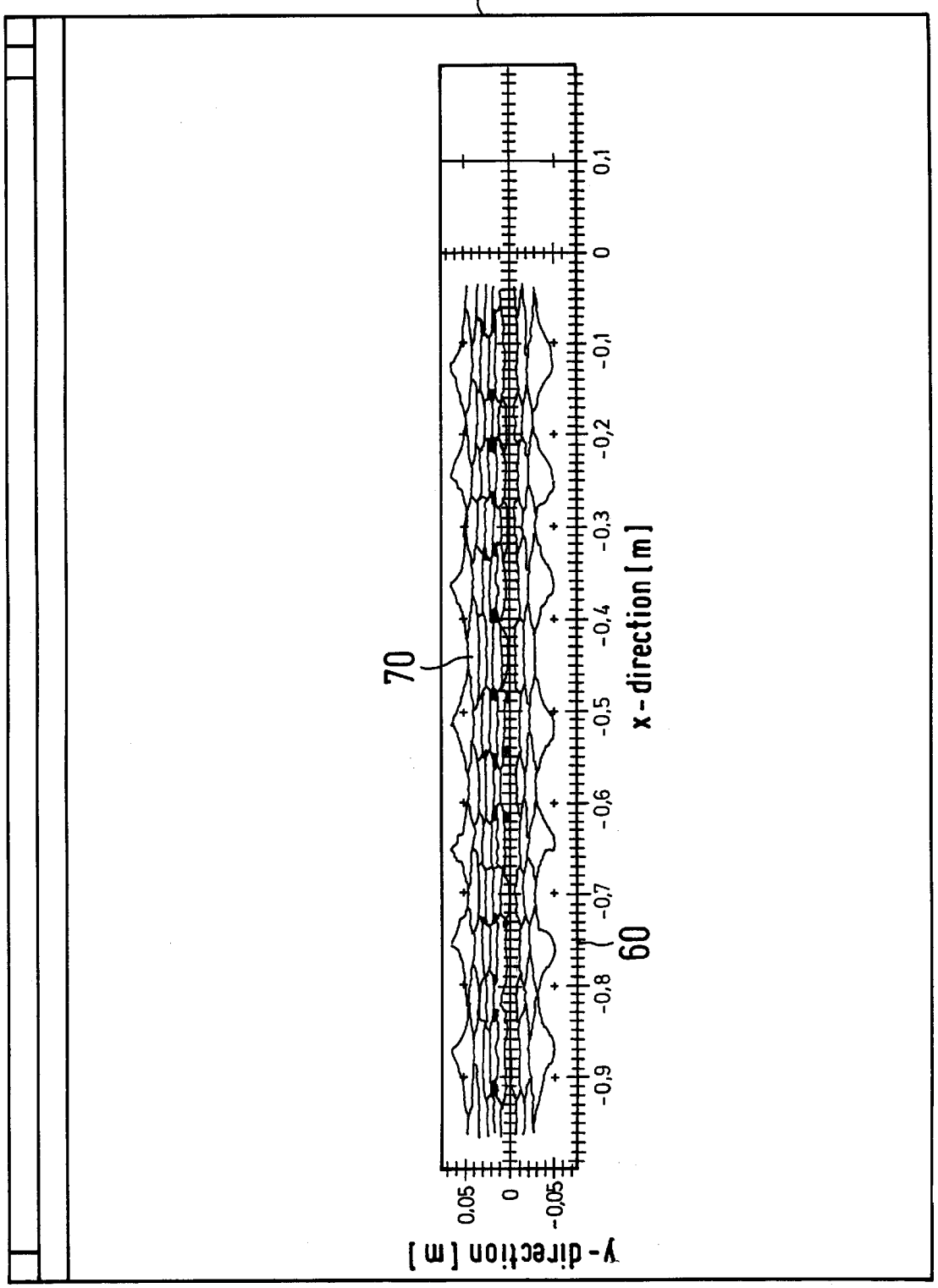
FIG. 9 is the electron beam path for a power distribution according to FIG. 8.

According to the invention, this power distribution is produced automatically. This happens in that the path of the electron beam is calculated automatically and taking into account the aforementioned error corrections. The result of this calculation is shown in FIG. 9, where one recognizes the path 70 of the electron beam. The power distribution on the rectangular crucible 60 is thus specified by way of a longitudinal and a transverse profile $P_x(x), P_y(y)$. The power distribution on this surface then results from the multiplication $$P(\bar{r}) = P_x(x) \cdot P_y(y); \ \bar{r} = \{x, y\}$$

If, rather than a rectangular crucible, a round one is involved, the specification can be done similarly.

Figure 10:
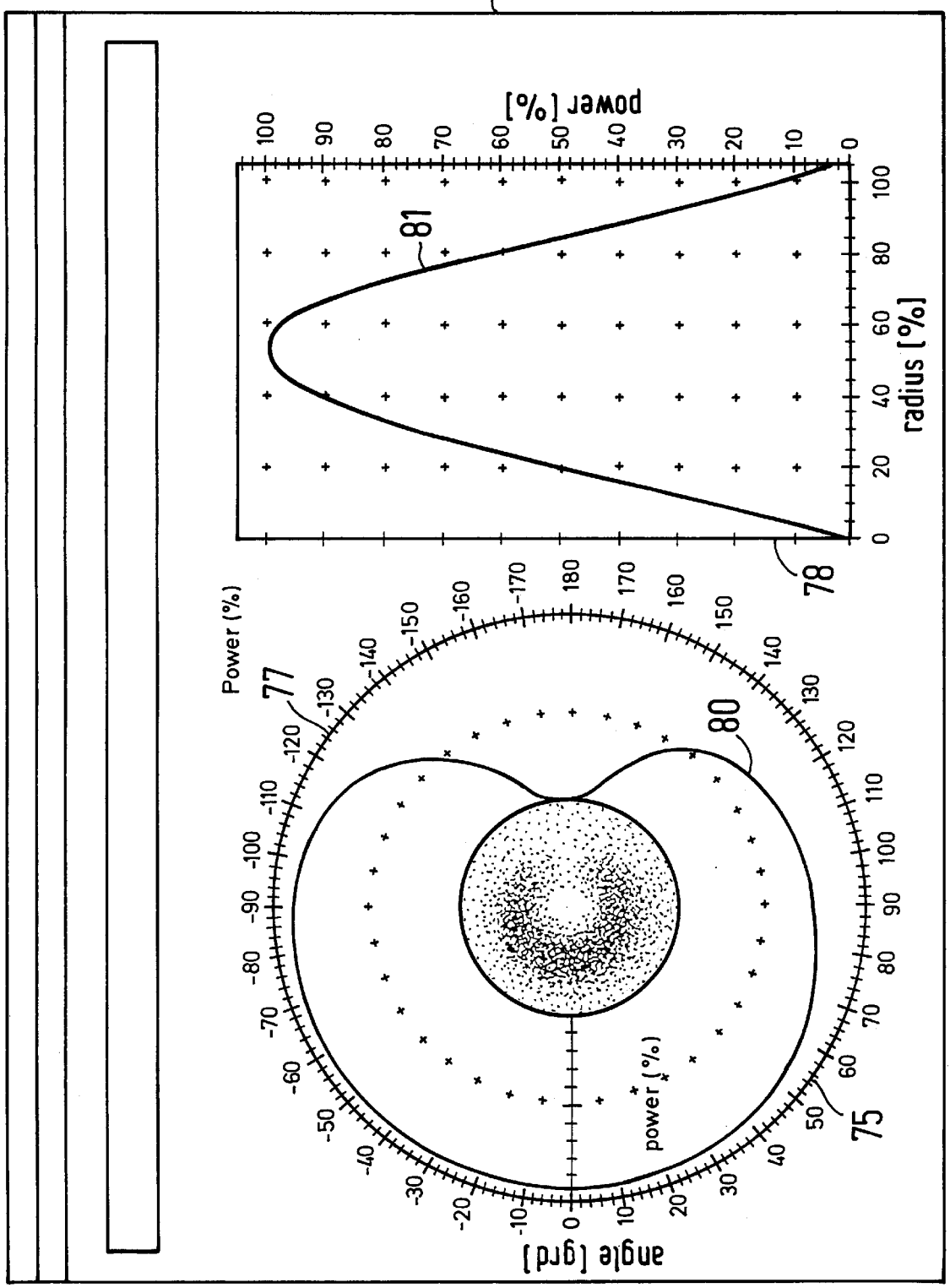
FIG. 10 is a specified power distribution for a round crucible.

In FIG. 10, a round crucible 75 with a certain nominal power distribution is shown. This crucible 75 is represented on a monitor screen with polar coordinates 77 and a radius-power plane 78 on a monitor screen 79. The curves 80,81 can now be specified by means of a light pen or other suitable measures, whereby the power distribution of the crucible is also established.

Figure 11:
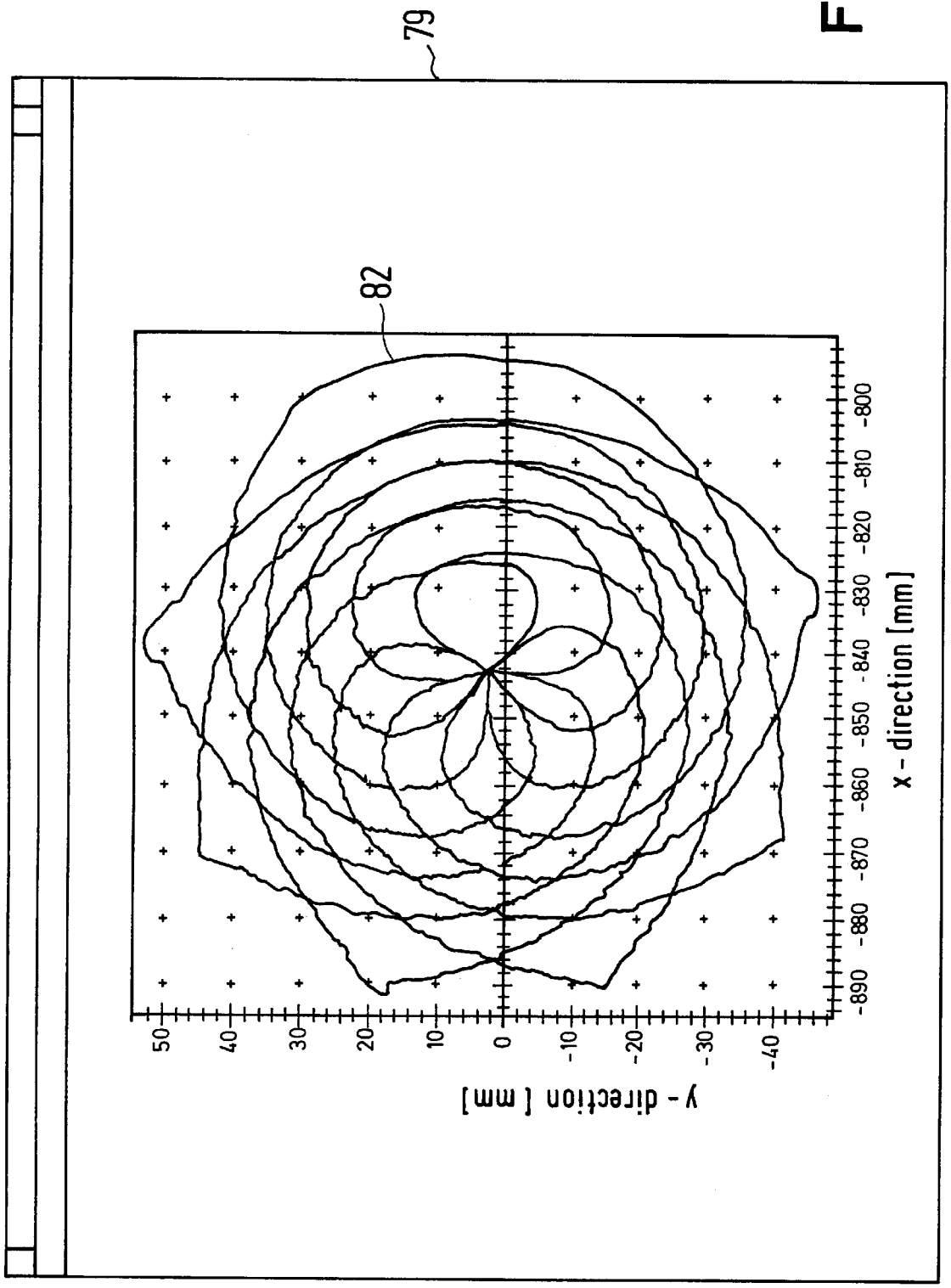
FIG. 11 is an electron beam path for a power distribution according to FIG. 10.

The path 82 of the electron beam which is associated with the power distribution shown in FIG. 10 is represented in FIG. 11. In the case of the round crucible 75, a radial and an azimuthal power distribution $P_r(r)$, $P_\phi(\phi)$ are specified. The resultant power then is obtained from $$P(\bar{r}) = P_r(r) \cdot P_\Phi(\Phi)$$

wherein $\bar{r} = \{r \cdot \cos(\Phi), r \cdot \sin(\Phi)\}$

The frequencies $\omega_x, \omega_y$ or $\omega_r, \omega_\theta$ of the deflection currents are in principle freely selectable. The resolution and shape of the deflection pattern can be influenced by the suitable choice of the frequency difference. This starting and ending points of the beam path are defined by way of the phases $\rho_x, \rho_y$ or $\rho_r, \rho_\theta$. Averaged over the time $T=1/\omega$, the above defined power profile results, independently of the selection of frequencies and phases.

In particular, the frequency difference can be selected to be small, while simultaneously a deflection pattern can be generated that shows a high resolution. Thus the deflection frequencies are similar in the horizontal and the vertical direction. This reduces the requirement on the deflection system with regard to transmission characteristics of high frequencies (counter example in television technology: the line frequency (horizontal deflection) is considerably greater here than the picture frequency (vertical deflection)).

Figure 12:
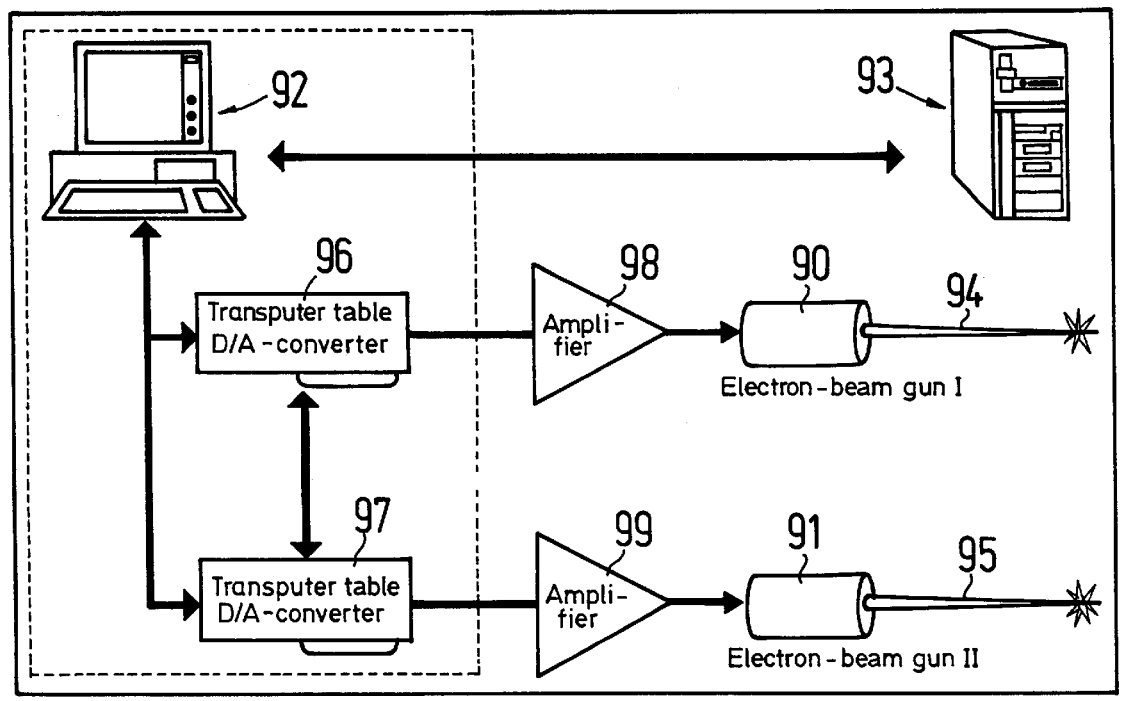
FIG. 12 is a schematic representation of the driving of two electron-beam guns according to the invention.

In FIG. 12, a schematic block diagram for the driving of two electron-beam guns 90,91 by means of a computer 92 is shown. This computer 92 can communicate with a control unit 93. The electron-beam guns 90,91 each generate an electron beam 94,95, whose position and intensity are specified by the computer 92. Signals are issued by this computer 92 to transputers with D/A converters 96,97, which in turn each drive an amplifier 98,99, each of which is connected to one of the two electron-beam guns 90,91. A transputer is understood to mean a 32-bit chip and computer which was developed by the British firm INMOS and serves above all for the parallel, i.e., simultaneous, processing of extensive amounts of data. An ordinary microprocessor is accompanied here by four communication units, which can each transfer 10 MB of data even during the computational activity of the processor. Thus computation-intensive tasks can be managed in a very short time.

Figure 13:
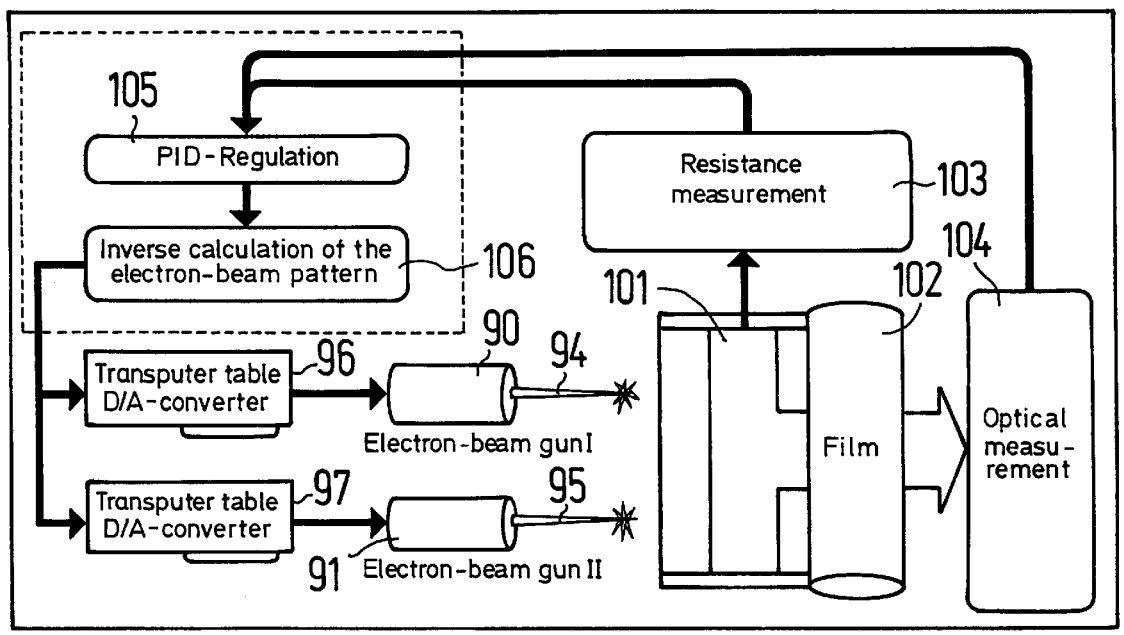
FIG. 13 is a schematic representation of a closed regulation system.

FIG. 13 shows a closed control loop for a device according to the invention. Here 101 labels a crucible, whose vaporization products end up on a rolled film 102. The measurement data picked up from the crucible 101 or the film 102 by means of measuring unit 103,104, electrical resistance values, for instance, or optical transmissivities, are supplied to a PID regulator 105, whose control signals are recalculated in a device 106 into electron-beam deflection patterns and supplied to the transputers 96,97 which drive the electron-beam guns 90,91.

Figure 14:
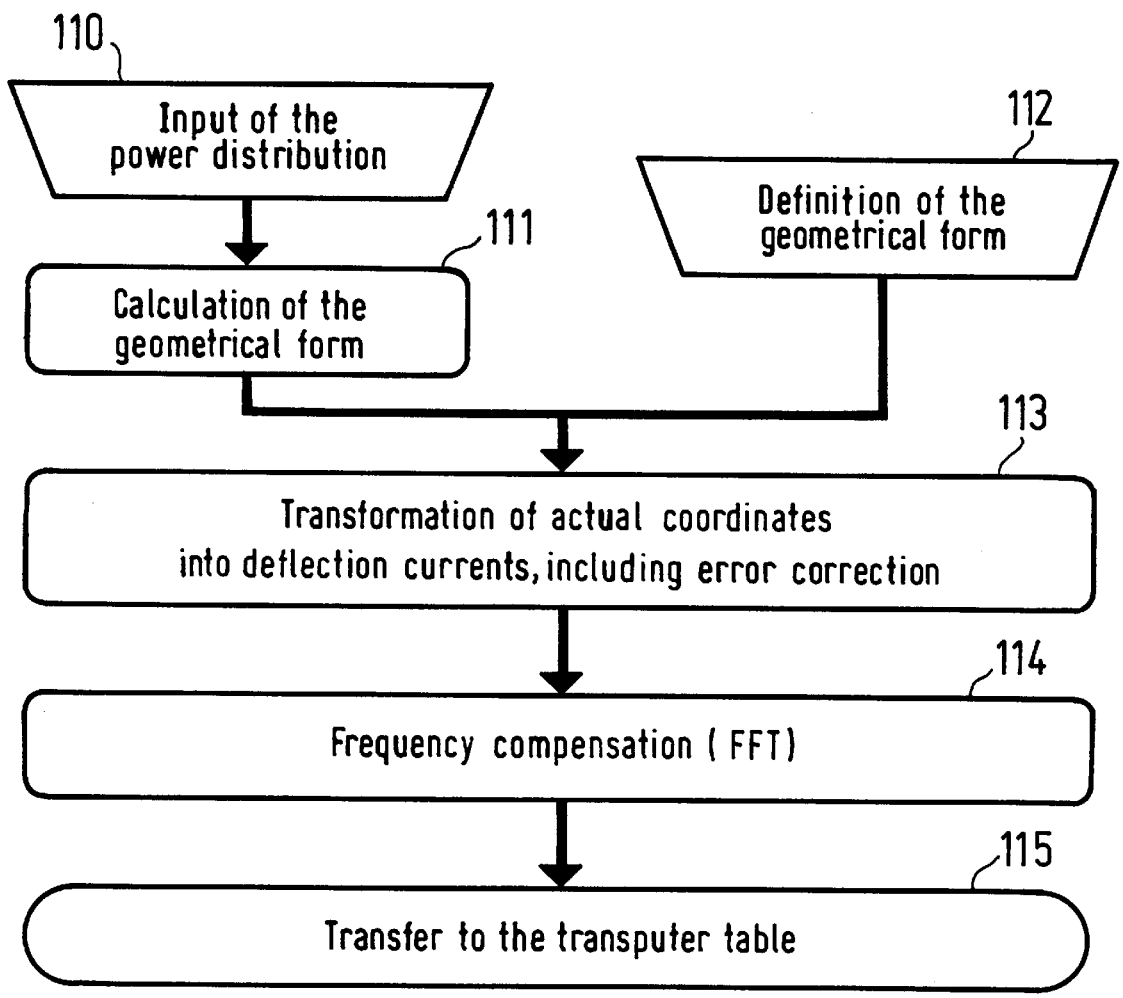
FIG. 14 is a geometrical representation of the various process paths according to the invention.

The essential steps in the implementation of the invention are indicated in FIG. 14. It is possible to specify either a power distribution or a geometrical pattern. If in block 112 a geometrical pattern, a circle, ellipse, etc., for an electron beam is specified, then the spatial coordinates are transformed at 113 into deflection currents with static correction. These statically corrected deflection currents are subjected at 114 to a dynamic frequency correction. The inverse-transformed result is supplied to the transputer at 115.

At the left side of FIG. 14 it is shown that at 110 a power distribution is specified in place of a geometrical pattern. The geometrical form is calculated at 111. The further sequence is then the same as for the specified geometrical pattern.

Further variations and modifications of the foregoing will be apparent to those skilled in the art and are intended to be encompassed by the claims.

German priority application 197 45 771.1 is relied on and incorporated herein by reference.

We claim:

1. A method for the operation of an electron beam which is employed for the vaporization or melting of a material in a crucible, comprising:

providing at least one deflection unit for the electron beam, said at least one deflection unit providing image defects;

selecting geometrical coordinates (x, y; r, $\phi$) of at least one point on the surface of the material to be vaporized or melted;

using an error-correction algorithm to transform said selected geometrical coordinates (x, y; r, $\phi$) into currents ($I_x$, $I_y$; $I_r$, $I_\phi$), wherein said error-correction algorithm is used for correcting the image defects of said at least one deflection unit;

supplying the currents to said at least one deflection unit;

directing with said at least one deflection unit the electron beam at an intensity onto the material to be vaporized or melted; and guiding the electron beam at a specifiable velocity over said at least one point of the surface of the material to be vaporized or melted.

2. The method according to claim 1 wherein the currents are statically corrected.

3. The method according to claim 1 wherein the currents are dynamically corrected.

4. The method according to claim 1 wherein the currents are first statically and then dynamically corrected.

5. The method according to claim 1, wherein the intensity of the electron beam is changed.

6. The method according to claim 1, wherein the intensity of the electron beam is essentially constant.

7. A method for the operation of an electron beam which is employed for the vaporization or melting of a material in a crucible, comprising:

providing at least one deflection unit for the electron beam, said at least one deflection unit providing image defects;

establishing a geometrical power distribution of the electron beam on the surface of the material to be vaporized or melted;

determining geometrical coordinates (x, y; r, $\phi$) of the power distribution on the surface of the material to be vaporized or melted;

using an error-correction algorithm to transform said geometrical coordinates (x, y; r, $\phi$) into currents ($I_x$, $I_y$; $I_r$, $I_\phi$), wherein said error-correction algorithm is used for correcting the image defects of said at least one deflection unit;

supplying the currents to said at least one deflection unit;

directing with said at least one deflection unit the electron beam at an intensity onto the material to be vaporized or melted; and guiding the electron beam at a specifiable velocity over at least one point of the surface of the material to be vaporized or melted.

* * * * *